(12) United States Patent  
Kim et al.

(10) Patent No.: US 10,283,735 B2
(45) Date of Patent: May 7, 2019

(54) ORGANIC LIGHT EMITTING DISPLAY DEVICE

(71) Applicant: LG DISPLAY CO., LTD., Seoul (KR)

(72) Inventors: Yeonji Kim, Chungcheongnam-do (KR); Hyounsung Son, Daegu (KR); Dongha Yoo, Gyeongsangbuk-do (KR); Seongwoo Oh, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/336,899

(22) Filed: Oct. 28, 2016

(65) Prior Publication Data

US 2017/0125743 A1 May 4, 2017

(30) Foreign Application Priority Data

Oct. 30, 2015 (KR) .......................... 10-2015-0152549

(51) Int. Cl.
*G02B 5/30* (2006.01)
*H01L 27/32* (2006.01)
*H01L 51/52* (2006.01)

(52) U.S. Cl.
CPC ........ *H01L 51/5281* (2013.01); *G02B 5/3016* (2013.01); *G02B 5/3083* (2013.01); *H01L 27/3211* (2013.01); *H01L 27/3244* (2013.01)

(58) Field of Classification Search
CPC ........................... G02B 5/3083; H01L 51/5281
See application file for complete search history.

(56) References Cited

U.S. PATENT DOCUMENTS

| 2002/0093284 A1 | 7/2002 | Adachi et al. |
| 2005/0035353 A1 | 2/2005 | Adachi et al. |
| 2010/0026450 A1 | 2/2010 | Hoshino et al. |
| 2010/0177265 A1* | 7/2010 | Jung .................. H01L 51/5281 349/69 |
| 2010/0320494 A1 | 12/2010 | Kim et al. |
| 2011/0007246 A1 | 1/2011 | Moon |
| 2015/0144909 A1 | 5/2015 | Byun et al. |
| 2015/0369981 A1* | 12/2015 | Takeda ................... G02B 5/305 359/488.01 |

FOREIGN PATENT DOCUMENTS

| CN | 101777289 A | 7/2010 |
| CN | 104681583 A | 6/2015 |
| CN | 104969101 A | 10/2015 |
| EP | 2148382 A1 | 1/2010 |
| EP | 2207220 A2 | 7/2010 |

(Continued)

OTHER PUBLICATIONS

Extended European Search Report (EESR) dated Mar. 16, 2017 for corresponding European Patent Application No. 16196180.0.

(Continued)

*Primary Examiner* — Raj R Gupta
(74) *Attorney, Agent, or Firm* — Morgan, Lewis & Bockius LLP

(57) ABSTRACT

An optical assembly in a display device includes a linear polarizer; a first quarter wave plate (QWP) layer under the linear polarizer, the first QWP layer having a negative dispersion characteristic; and a cholesteric liquid crystal (CLC) layer under the linear polarizer.

15 Claims, 11 Drawing Sheets

(56) References Cited

FOREIGN PATENT DOCUMENTS

| | | |
|---|---|---|
| EP | 2879197 A1 | 6/2015 |
| JP | 2001-195003 A | 7/2001 |
| JP | 2004-134306 A | 4/2004 |
| KR | 10-2009-0096437 A | 9/2009 |
| KR | 10-2009-0099248 A | 9/2009 |
| KR | 10-2010-0082557 A | 7/2010 |
| KR | 10-2011-0006225 A | 1/2011 |
| KR | 10-2015-0078391 A | 7/2015 |
| TW | I243928 B | 11/2005 |
| WO | 2014/123038 A1 | 8/2014 |

OTHER PUBLICATIONS

Office Action dated Apr. 25, 2017 for corresponding Taiwanese Patent Application No. 105135130.
Office Action dated Jul. 15, 2016, for corresponding Korean Patent Application No. 10-2015-0152549.
Notice of Allowance dated Jan. 18, 2017, for corresponding Korean Patent Application No. 10-2015-0152549.
Search Report dated Jan. 23, 2018 from the European Patent Office in related European application No. 16196180.0.
Communication dated Oct. 16, 2018 from the European Patent Office in related European application No. 16196180.0.
The First Office Action dated Nov. 1, 2018, from the State Intellectual Property Office of People's Republic of China in counterpart Chinese application No. 201610971967.3.

* cited by examiner

◉ : RED
◎ : GREEN
◉ : BLUE

○ : RED
○ : GREEN
○ : BLUE

ORGANIC LIGHT EMITTING DISPLAY DEVICE

The present application claims the benefit of Korean Application No. 10-2015-0152549, filed in Korea on Oct. 30, 2015, which is hereby incorporated by reference.

BACKGROUND OF THE INVENTION

Field of the Invention

The present invention relates to an organic light emitting display device, and more particularly, to an organic light emitting display device with low reflection.

Discussion of the Related Art

Recently, as the importance for information displays has been on the rise, and the demand for using portable information mediums has increased, research into and commercialization of lighter, thinner flat panel displays (FPDs) to replace cathode ray tube (CRT) displays and other existing display technologies have been actively conducted. In the flat panel display field, liquid crystal displays (LCDs) have come to prominence. However, because LCDs are light receiving devices rather than light emitting devices and have shortcomings in terms of brightness, contrast ratio, viewing angle, and the like, novel display technologies to overcome such shortcomings have been actively developed.

An organic light emitting display device, one of these display device technologies, is self-luminous and, thus, is excellent in terms of a viewing angle and a contrast ratio. Also, because an organic light emitting display device does not require a backlight, the organic light emitting display device may be lighter and thinner and is advantageous in terms of power consumption. In addition, the organic light emitting display device may be driven by a low DC voltage with a fast response speed.

Hereinafter, a basic structure and operational characteristics of an organic light emitting display device will be described in detail with reference to the accompanying drawings. FIG. 1 is a diagram illustrating a light emitting principle of a general organic light emitting diode.

In general, an organic light emitting display device includes an organic light emitting diode (OLED), as illustrated in FIG. 1. The OLED includes an anode 18 as a pixel electrode, a cathode 28 as a common electrode, and organic layers 30a, 30b, 30c, 30d, and 30e formed between the anode 18 and the cathode 28.

The organic layers 30a, 30b, 30c, 30d, and 30e include a hole transport layer (HTL) 30b, an electron transport layer (ETL) 30d, and an emission layer (EML) 30c interposed between the hole transport layer 30b and the electron transport layer 30d. Here, to enhance luminous efficiency, a hole injection layer (HIL) 30a is interposed between the anode 18 and the hole transport layer 30b, and an electron injection layer (EIL) 30e is interposed between the cathode 28 and the electron transport layer 30d.

In the OLED configured in such a manner, when a positive (+) voltage and a negative (−) voltage are applied to the anode 18 and the cathode 28, respectively, holes passing through the hole transport layer 30b and electrons passing through the electron transport layer 30d are transferred to the emission layer 30c to form excitons. When the excitons transit from an excited state to a ground state, namely, a stable state, light is generated.

In the organic light emitting display device, sub-pixels each including the OLED having the foregoing structure are arranged in a matrix form and selectively controlled with a data voltage and a scan voltage to display an image. Here, the organic light emitting display device is classified into a passive matrix type organic light emitting display device or an active matrix type organic light emitting display device using a thin film transistor (TFT) as a switching element. Here, in the active matrix type organic light emitting display device, a TFT, an active element, is selectively turned on to select a sub-pixel and light emission of the sub-pixel is maintained with a voltage maintained in a storage capacitor. In such a general organic light emitting display device, a circular polarizer is applied to an upper surface of a panel assembly to reduce reflection due to various types of wires or electrodes formed of a metallic material.

FIG. 2 is a view exemplarily illustrating a structure of a general organic light emitting display device, and FIG. 3 is a view exemplarily illustrating another structure of a general organic light emitting display device.

As shown in FIGS. 2 and 3, a circular polarizer including a quarter wave plate (QWP) 62 and a linear polarizer 63 is applied to an upper surface of a panel assembly 2 to reduce reflection. A protection layer 66 may also be provided on a top surface.

In the related art organic light emitting display device, visibility is reduced outdoors (e.g., under sunlight conditions), and reflectance is increased due to the organic light emitting diodes, as well as various types of wires or electrodes. Further, wires, electrode patterns, or the like may be seen. To solve such a problem, a circular polarizer is applied.

That is, if the quarter wave plate 62 is arranged on the panel assembly 2 such that its optical axis forms an angle of 45° with a transmission axis of the linear polarizer 63, external light will be reflected from the inside of the panel assembly 2. The reflected light is discharged to the outside in a direction perpendicular to the transmission axis of the linear polarizer 63. This may lead to lower reflectance. For reference, reflectance is a function of refractivity and is increased as a refractivity ratio is increased. Air has refractivity of 1, and glass has refractivity of 1.5. Thus, when light is incident onto a front surface of the glass from air, about 4% of the incident light is reflected.

However, in the structure of FIG. 2, brightness in the organic light emitting display device of the related art is reduced by at least 50%. That is, transmittance (transmissivity, transmission factor) of the linear polarizer 63 is about 40%~50%, and light generated from the organic light emitting diode has its brightness reduced to about 40%~50% after passing through the circular polarizer.

As shown in FIG. 3, in a case where a dual brightness enhancement film (DBEF) 67 is applied between the quarter wave plate 62 and the linear polarizer 63, brightness may be enhanced but reflectance may be also increased as a trade-off.

Further, a sunglasses effect is not considered in the related art. That is, in a case in which a transmission axis of polarized sunglasses worn by the user is perpendicular to the transmission axis of the linear polarizer 63 of the organic light emitting display device, a user may not be able to view the display being driven because the screen appears to be black.

SUMMARY

Accordingly, the present invention is directed to an organic light emitting display device that substantially obviates one or more of the problems due to limitations and disadvantages of the related art.

An object of the present invention is to provide an organic light emitting display device capable of enhancing reflectance and brightness, and minimizing color cast.

Another object of the present invention is to provide an organic light emitting display device permitting a user wearing sunglasses to recognize an image at all angles.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an optical assembly in a display device comprises a linear polarizer; a first quarter wave plate (QWP) layer under the linear polarizer, the first QWP layer having a negative dispersion characteristic; and a cholesteric liquid crystal (CLC) layer under the linear polarizer.

In another aspect, an optical assembly in a display device comprises a linear polarizer; a first quarter wave plate (QWP) layer under the linear polarizer; a cholesteric liquid crystal (CLC) layer under the linear polarizer; and a second QWP layer on the linear polarizer.

In another aspect, a display device comprises a substrate; an plurality of sub-pixels on the substrate, each of the sub-pixels including at least one organic light emitting diode (OLED); and an optical assembly on the sub-pixels including a linear polarizer, a first quarter wave plate (QWP) layer under the linear polarizer, and a cholesteric liquid crystal (CLC) layer under the linear polarizer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
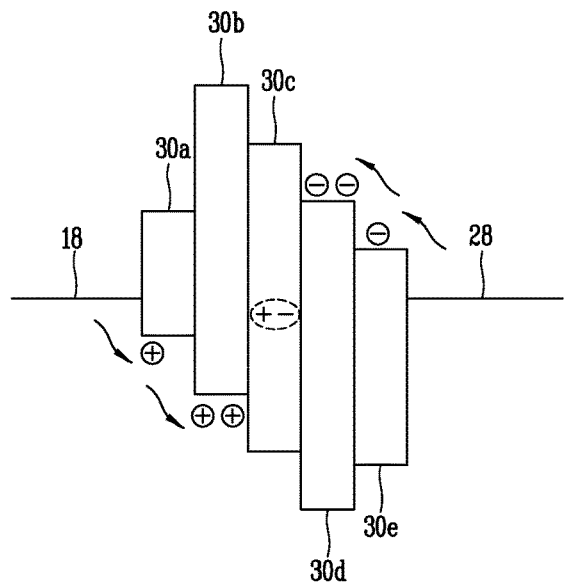
FIG. 1 is a diagram illustrating a principle to emit light by an organic light emitting diode in accordance with the related art.
Figure 2:
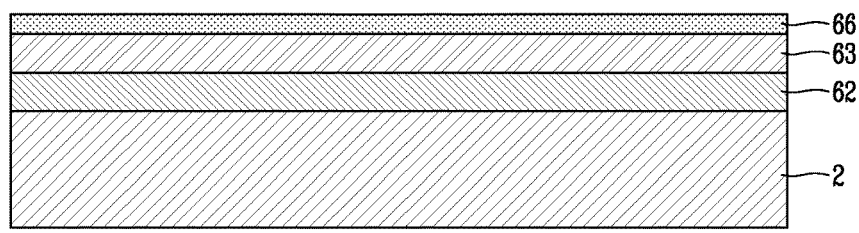
FIG. 2 is a view exemplarily illustrating a structure of a general organic light emitting display device.
Figure 3:
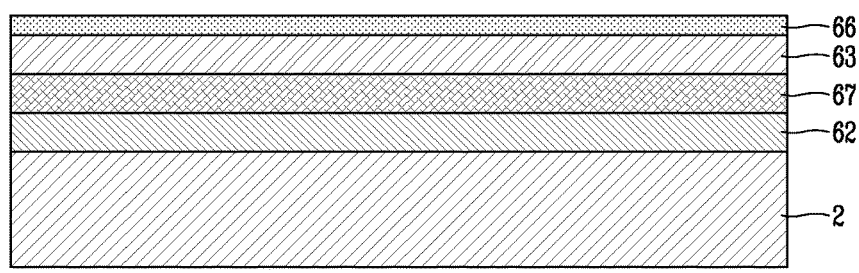
FIG. 3 is a view exemplarily illustrating another structure of a general organic light emitting display device.

Hereinafter, an organic light emitting display device in embodiments will be described in detail with reference to the accompanying drawings such that they can be easily practiced by those skilled in the art to which the present disclosure pertains.

The advantages and features of the present disclosure and methods for achieving these will be clarified in detail through embodiments described hereinafter in conjunction with the accompanying drawings. However, embodiments of the present disclosure may, however, be implemented in many different forms and should not be construed as being limited to the embodiments set forth herein. Rather, these embodiments are provided so that this disclosure will be thorough and complete, and will fully convey the scope of the invention to those skilled in the art and are defined by the claim coverage of the present disclosure. Throughout the specification, the same reference numerals will be used to designate the same or like components. In the drawings, the sizes or shapes of elements may be exaggeratedly illustrated for clarity and convenience of description.

It will be understood that when an element or layer is referred to as being "on" or "connected to" another element or layer, it can be directly on or directly connected to the other element or layer, or intervening elements or layers may be present.

Relative terms, such as "lower" or "bottom" and "upper" or "top," may be used herein to describe relationship of one or more elements to other elements as illustrated in the Figures. It will be understood that relative terms are intended to encompass different orientations of the device in addition to the orientation depicted in the figures. For example, if a device in the Figures is turned over, elements described as being on the "lower" side of another element would then be oriented on the "upper" side of the another element. The exemplary term "lower" can, therefore, encompass both orientations of "lower" and "upper," depending of the particular orientation of the figure. Similarly, if the device in one of the figures is turned over, elements described as "below" or "beneath" other elements would then be oriented "above" the other elements. The terms "below" or "beneath" can therefore encompass both orientations of above and below.

The terms used herein are for the purpose of describing particular embodiments only and are not intended to limit example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 4:
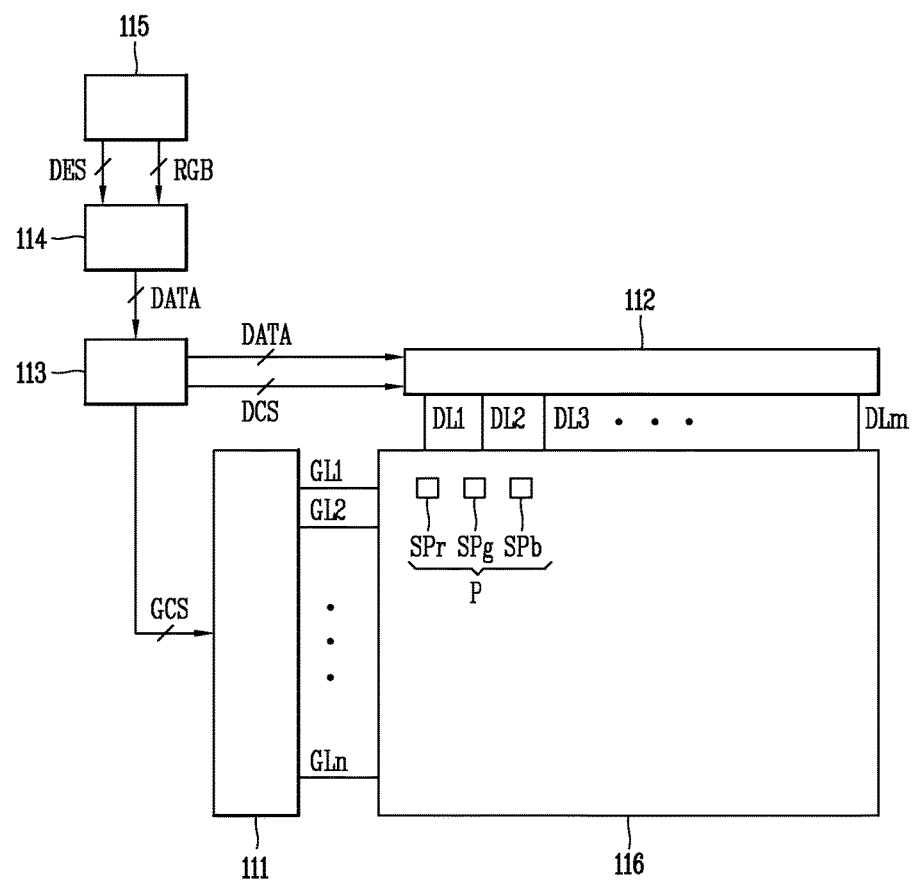
FIG. 4 is a block diagram schematically illustrating an organic light emitting display device according to an example embodiment of the present invention.

FIG. 4 is a block diagram schematically illustrating an organic light emitting display device according to an example embodiment of the present invention.

With reference to FIG. 4, the organic light emitting display device may include an image processing unit 115, a data conversion unit 114, a timing controller 113, a data driver 112, a gate driver 111, and a display panel 116. The image processing unit 115 performs various image processing such as setting a gamma voltage to achieve maximum luminance according to an average image level using an RGB data signal (RGB), and subsequently outputs the RGB data signal (RGB). The image processing unit 115 outputs a driving signal including one or more of a vertical synchronization signal (Vsync), a horizontal synchronization signal (Hsync), a data enable signal (DES), and a clock signal CLK.

The timing controller 113 receives a driving signal including one or more of the (optionally converted) RGB data signal, the vertical synchronization signal (Vsync), the horizontal synchronization signal (Hsync), the data enable signal (DES) and the clock signal CLK from the image processing unit 115 or the data conversion unit 114. The timing controller 113 outputs a gate timing control signal GCS for controlling the operation timing of the gate driver 111 and a data timing control signal DCS for controlling the operation timing of the data driver 112 on the basis of the driving signal. The timing controller 113 outputs a data signal DATA according to the gate timing control signal CGS and the data timing control signal DCS.

In response to the data timing control signal DCS supplied from the timing controller 113, the data driver 112 samples and latches the data signal DATA supplied from the timing controller 113, converts the signal into a gamma reference voltage, and outputs the gamma reference voltage. The data driver 112 outputs the data signal DATA through data lines DL1 to DLm. The data driver 112 may be formed as an integrated circuit (IC).

In response to the gate timing control signal CGS supplied from the timing controller 113, the gate driver 111 outputs a gate signal while shifting a level of a gate voltage. The gate driver 111 outputs the gate signal through gate lines GL1 to GLn. The gate driver 111 may be formed as an IC or may be formed in a gate-in-panel (GIP) manner in the display panel 116.

The display panel 116 may have a sub-pixel structure including a red sub-pixel SPr, a green sub-pixel SPg, and a blue sub-pixel SPb. That is, a single pixel P includes RGB sub-pixels SPr, SPg, and SPb. However, the structure of the display panel 116 is not limited thereto and may include a white sub-pixel.

Figure 5:
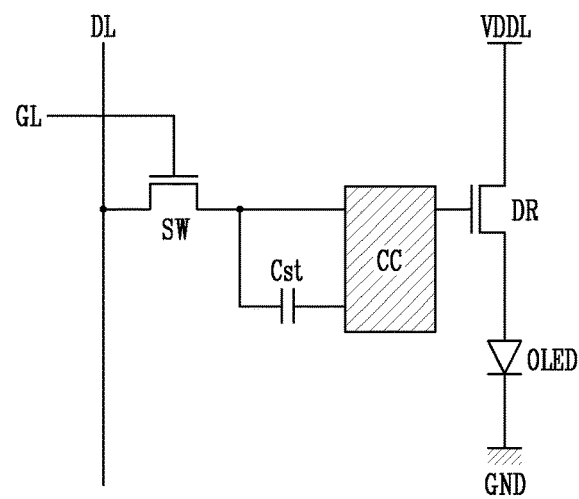
FIG. 5 is an exemplary view illustrating an example configuration of a circuit regarding a sub-pixel of an organic light emitting display device.

FIG. 5 is a view illustrating an example configuration of a circuit regarding a sub-pixel of an organic light emitting display device. The sub-pixel illustrated in FIG. 5 has a 2T (transistor) 1C (capacitor) structure including a switching transistor, a driving transistor, a capacitor, and an OLED, for example. However, the sub-pixel is not limited thereto and may be variously modified to have a structure of 3T1C, 4T2C, or 5T2C in case where a compensation circuit is added.

With reference to FIG. 5, in the organic light emitting display device, the sub-pixel region is defined by a gate line GL, which is arranged in a first direction, and a data line DL and a driving power line VDDL, which are arranged in a second direction intersecting the first direction, e.g., perpendicular to the first direction, and spaced apart from each other. A single sub-pixel may include a switching transistor SW, a driving transistor DR, a capacitor Cst, a compensation circuit CC, and an OLED.

The OLED operates to emit light according to a driving current formed by the driving transistor DR. In response to a gate signal supplied through the gate line GL, the switching transistor SW performs a switching operation such that a data signal supplied through the data line DL is stored as a data voltage in the capacitor Cst. The driving transistor DR operates to allow a driving current to flow between the driving power line VDDL and a ground line GND according to the data voltage stored in the capacitor Cst. The compensation circuit CC compensates for a threshold voltage, or the like, of the driving transistor DR. The compensation circuit CC may include one or more transistors and one or more capacitors. The compensation circuit (CC) may be variously configured, and a specific example and a description thereof will be omitted.

The organic light emitting display device having the foregoing sub-pixel structure may be implemented as a top emission type organic light emitting display device, a bottom emission type organic light emitting display device, or a dual-emission type organic light emitting display device. However, the present invention is not limited to such types.

Figure 6:
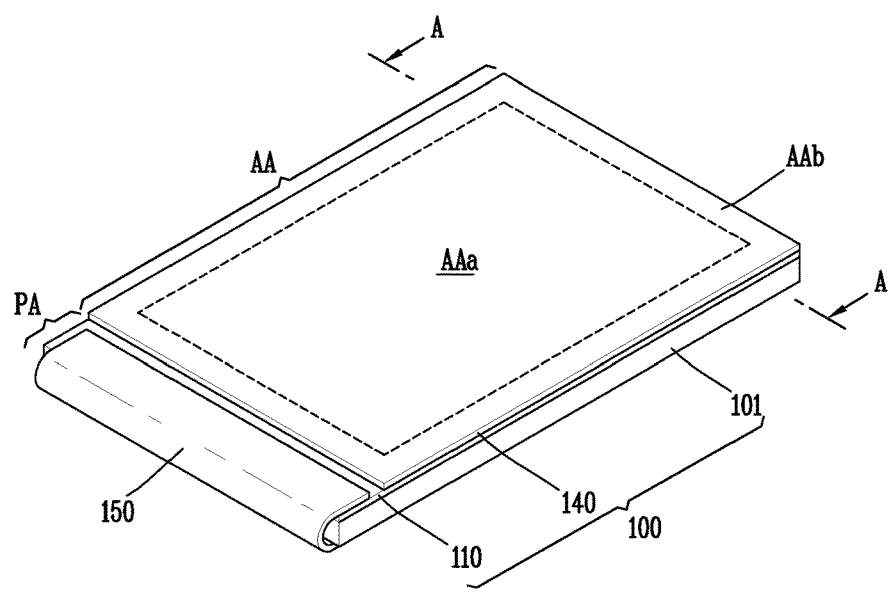
FIG. 6 is a perspective view illustrating a structure of an organic light emitting display device according to a first example embodiment of the present invention.
Figure 7:
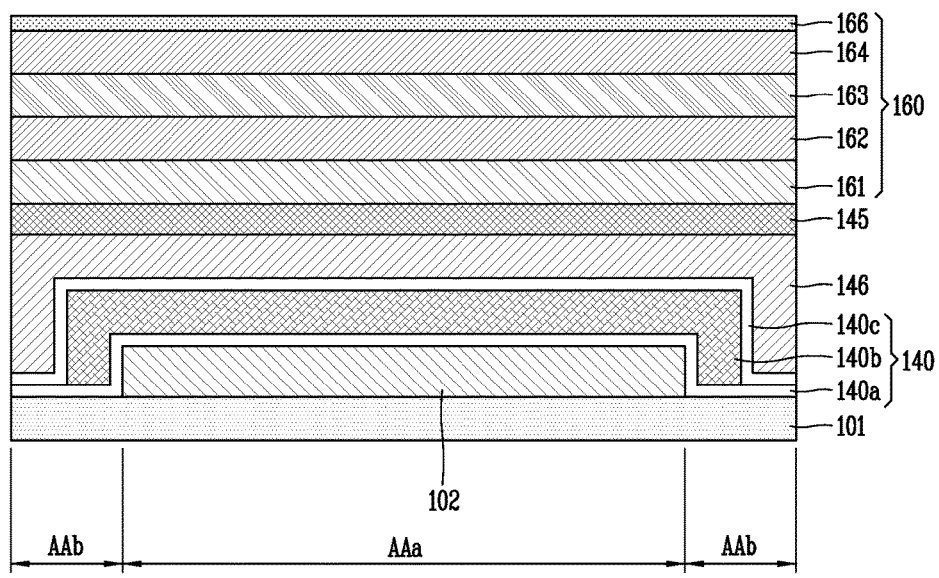
FIG. 7 is a cross-sectional view illustrating a structure of an organic light emitting display device according to the first example embodiment of the present invention.
Figure 8:
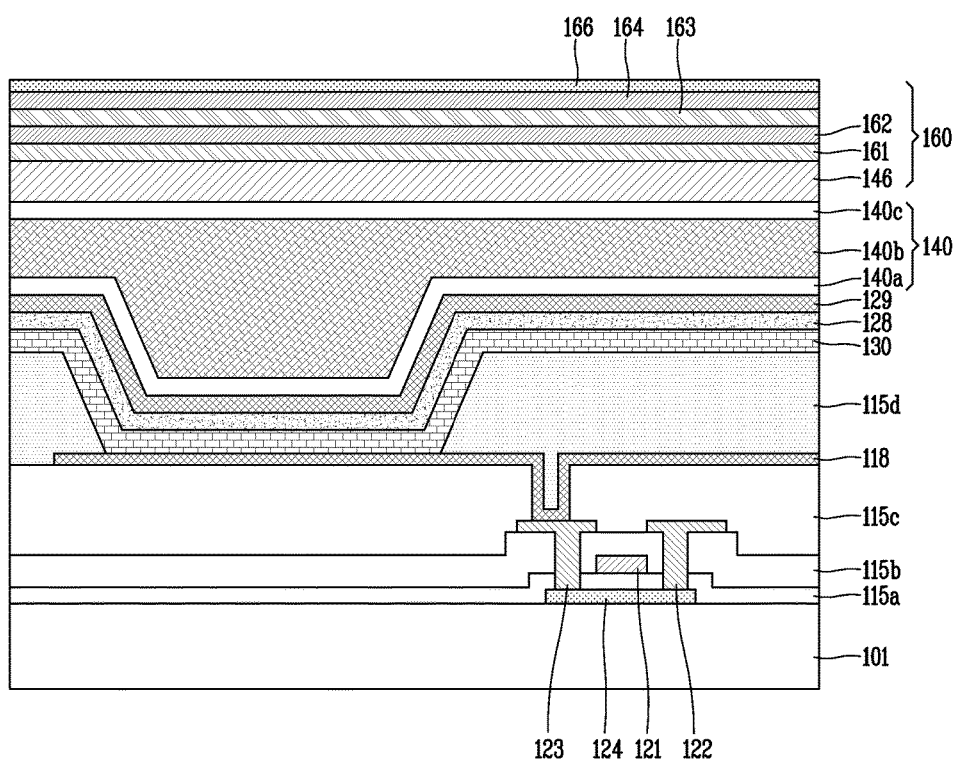
FIG. 8 is a cross-sectional view illustrating in detail a part of the organic light emitting display device shown in FIG. 7.

FIG. 6 is a perspective view illustrating a structure of an organic light emitting display device according to a first example embodiment of the present invention, which shows the organic light emitting display device in a state where a flexible printed circuit board is coupled to the organic light emitting display device. FIG. 7 is a cross-sectional view illustrating a structure of an organic light emitting display device according to the first example embodiment of the present invention, which shows a cross-sectional surface taken along line A-A of FIG. 6. FIG. 8 is a sectional view illustrating in detail part of the organic light emitting display device shown in FIG. 7, which shows a cross-sectional surface of a panel portion and a thin film encapsulation layer. The panel portion has a structure where a plurality of sub-pixels is arranged in a matrix form. Each sub-pixel may include a red sub-pixel for emitting red light, a green sub-pixel for emitting green light, and a blue sub-pixel for emitting blue light.

With reference to FIG. 6, the organic light emitting display device according to the first example embodiment of the present invention includes a panel assembly 100 for displaying an image, and a flexible printed circuit board 150 connected to the panel assembly 100. The panel assembly 100 is provided on a substrate 101. And, the panel assembly 100 includes a panel portion 110 divided into an active region AA and a pad region PA, and a thin film encapsulation layer 140 provided on the panel portion 110 with covering the active region AA.

The active region AA may be divided into a pixel portion AAa for substantially displaying an image as a plurality of sub-pixels are arranged, and an outer peripheral portion AAb formed around the pixel portion AAa and configured to transmit a signal applied from the outside, into the pixel portion AAa. The thin film encapsulation layer 140 is formed on the panel portion 110 with covering part of the pixel portion AAa and the outer peripheral portion AAb. In this case, a part of the panel portion 110 is exposed to the outside without being covered by the thin film encapsulation layer 140, and constitutes a pad region PA where a pad is formed.

The substrate 101 may be a flexible substrate. The flexible substrate may be formed of a plastic material having an excellent heat resistance and durability, such as polyethyeleneterepthalate (PET), polyethyelenennapthalate (PEN), polycarbonate (PC), polyallylate, polyetherimide (PEI), polyethersulphone (PES), or polyimide. However, the present invention is not limited to the above examples, and the substrate 101 may be formed of a variety of materials or various materials having flexibility.

In the case of a bottom emission type organic light emitting display device where an image is formed in a substrate direction, the substrate 101 should be formed of a transparent material. On the contrary, in the case of a top emission type organic light emitting display device where an image is formed in a direction opposite to the substrate direction, the substrate 101 is not formed of a transparent material. In this case, the substrate 101 may be formed of a metallic material. If the substrate 101 is formed of a metallic material, the substrate 101 may include one or more metals selected from a group, such as, carbon, iron, chrome, manganese, nickel, titanium, molybdenum, and stainless steel. However, the present invention is not limited thereto.

The panel portion 110 is disposed on an upper surface of the substrate 101. In this specification, the panel portion 110 may include organic light emitting diodes and a TFT array for driving the organic light emitting diodes. The panel portion 110 includes an active region AA for displaying an image, and a pad region PA for driving the display of an image. Although not shown, pixels are arranged in the active region AA in a matrix form, and a driving device for driving pixels (e.g., a scan driver, a data driver, etc.) and other components are disposed outside the active region AA.

The thin film encapsulation layer 140 is formed on an upper surface of the substrate 101 to cover part of the panel portion 110. An organic light emitting diode (OLED) included in the panel portion 110 is formed of one or more organic materials, which are easily deteriorated by external moisture or oxygen. To protect such an OLED, the panel portion 110 should be sealed. The thin film encapsulation layer 140, the panel portion 110 is sealed with a structure where a plurality of inorganic films and a plurality of organic films are alternately stacked on each other. Because the panel portion 110 is sealed by the thin film encapsulation layer 140 rather than an encapsulation substrate, the organic light emitting display device may have a small thickness and a flexible structure. However, the present invention is not limited to the above implementation.

Part of the panel portion 110, exposed to the outside without being covered by the thin film encapsulation layer 140, constitutes the aforementioned pad region PA. An integrated circuit chip (not shown) may be mounted to the pad region PA of the panel assembly 100 by a chip on glass (COG) method.

Electronic devices (not shown) for processing a driving signal may be mounted to the flexible printed circuit board 150 by a chip on film (COF) method, and a connector (not shown) for transmitting an external signal to the flexible printed circuit board 150 may be installed to the flexible printed circuit board 150. The flexible printed circuit board 150 may be bent toward a rear side of the panel assembly 100 to face a rear surface of the panel assembly 100. In this case, an anisotropy conductive film (not shown) may be used to electrically connect a terminal part of the panel portion 110 with a connection part of the flexible printed circuit board 150.

With reference to FIGS. 7 and 8, the thin film encapsulation layer 140 will be explained in more detail. For instance, a capping layer 129 may be formed on an upper surface of the substrate 101 where an organic light emitting diode 102 has been formed. Then, a primary protection film 140a, an organic film 140b, and a secondary protection film 140c may be sequentially formed on the capping layer 129 as an encapsulation, thereby forming the thin film encapsulation layer 140. However, as mentioned above, the number of inorganic films and organic films which constitute the thin film encapsulation layer 140 is not limited to the above described configuration.

The primary protection film 140a has low step coverage due to a TFT disposed therebelow because the primary protection film 140a is formed of an inorganic insulating film. However, because the organic film 140b on the primary protection film 140a serves as a planarizer, the secondary protection film 140c is not influenced by a film disposed below the secondary protection film 140c. Further, because the organic film 140b is formed of a polymer with a large thickness, cracks caused by foreign materials may be compensated.

A protection film 145 formed of multiple layers for encapsulation is disposed on an entire surface of the substrate 101 including the secondary protection film 140c. And, a transparent adhesive 146 may be disposed between the substrate 101 and the protection film 145.

An optical member 160 configured to prevent reflection of light incident from the outside may be provided on the protection film 145. The optical member 160 will be explained later.

As shown in FIG. 8, each sub-pixel may include an organic light emitting diode, and an electronic device electrically connected to the organic light emitting diode. The electronic device may include at least two TFTs, a storage capacitor, etc. The electronic devices are electrically connected to wires, thereby receiving an electric signal from a driving device outside the panel portion. Such electronic devices electrically connected to the organic light emitting diodes, and the wires are arranged to form a TFT array.

FIG. 8 illustrates an organic light emitting diode and a driving TFT for driving the organic light emitting diode in a single sub-pixel. However, this is merely for a concise description, and the present invention is not limited to this structure. That is, a plurality of TFTs, a plurality of storage capacitors, and various types of wires may be further included.

The TFT shown in FIG. 8 is a top gate type TFT, and includes an active layer 124, a gate electrode 121, and source/drain electrodes 122, 123, sequentially. The present invention is not limited to the illustrated top gate type TFT, and various types of TFTs may be applied.

The organic light emitting diode includes a first electrode 118, an organic compound layer 130, and a second electrode 128. Although not shown, the organic compound layer 130 may include not only a light emitting layer where light emission occurs, but also various organic layers for efficiently transferring carriers, such as holes or electrons, to the light emitting layer. The organic layers may include a hole injection layer and a hole transport layer disposed between the first electrode 118 and the light emitting layer, and an electron injection layer and an electron transport layer disposed between the second electrode 128 and the light emitting layer. The first electrode 118 formed of transparent oxide is formed on the TFT array, and the organic compound layer 130 and the second electrode 128 are sequentially disposed on the first electrode 118.

In the organic light emitting diode having such a structure, holes injected from the first electrode 118 via the hole transport layer and electrons injected from the second electrode 128 via the electron transport layer are coupled to each other at the light emitting layer. And, the holes and the electrons move to a low energy level. During such processes, light of a wavelength corresponding to an energy gap at the light emitting layer is generated.

In this case, for emission of white light, the light emitting layer may include a red light emitting layer, a green light emitting layer, and a blue light emitting layer. However, the present invention is not limited to this configuration.

In addition, the TFT includes a switching transistor and a driving transistor. Although not shown, the switching transistor is connected to a scan line and a data line, and transmits a data voltage, inputted to the data line, to the driving transistor according to a switching voltage, inputted to the scan line. The storage capacitor is connected to the switching transistor and a power line, and stores a voltage difference between a voltage received from the switching transistor and a voltage supplied to the power line.

The driving transistor is connected to the power line and the storage capacitor, and supplies the organic light emitting diode with an output current proportional to a square of a difference between a voltage stored in the storage capacitor and a threshold voltage. Then, the organic light emitting diode emits light by the output current.

The driving transistor includes an active layer 124, a gate electrode 121, and source/drain electrodes 122, 123. And, the first electrode 118 of the organic light emitting diode may be connected to the drain electrode 123 of the driving transistor. That is, the driving transistor includes a buffer layer (not shown) formed on the substrate 101, an active layer 124 formed on the buffer layer, a first insulating layer 115a formed on the substrate 101 where the active layer 124 has been formed, a gate electrode 121 formed on the first insulating layer 115a, a second insulating layer 115b formed on the substrate 101 where the gate electrode 121 has been formed, and source/drain electrodes 122, 123 formed on the second insulating layer 115b and electrically connected to source/drain regions of the active layer 124 via first contact holes.

In this case, the buffer layer may be formed as a single layer or multiple layers and may protect a TFT, formed during a subsequent process, from impurities, such as alkali ions discharged from the substrate 101. The active layer 124 may be formed of amorphous silicon or polycrystalline silicon formed by crystallizing amorphous silicon, an oxide semiconductor, an organic semiconductor, or the like.

The gate electrode 121 may be formed of an aluminum-based metallic material, such as aluminum (Al) or aluminum alloy (Al alloy), a silver-based metallic material, such as silver (Ag) or silver alloy (Ag alloy), a copper-based metallic material, such as copper (Cu) or copper alloy (Cu alloy), a molybdenum-based metallic material, such as molybdenum (Mo) or molybdenum alloy (Mo alloy), or a low-resistance opaque conductive material, such as chrome (Cr), tantalum (Ta), or titanium (Ti). However, the one or more foregoing materials may constitute a multi-layered structure having two conductive films having different physical properties.

The first insulating layer 115a and the second insulating layer 115b may be formed as a single layer formed of an inorganic insulating material, such as a silicon nitride (SiNx) or silicon oxide (SiO$_2$), or as double layers formed of a silicon nitride (SiNx) and silicon oxide (SiO$_2$).

The source electrode 122 and the drain electrode 123 may be formed of an aluminum-based metallic material, such as aluminum (Al) or aluminum alloy (Al alloy), a silver-based metallic material, such as silver (Ag) or silver alloy (Ag alloy), a copper-based metallic material, such as copper (Cu) or copper alloy (Cu alloy), a molybdenum-based metallic material, such as molybdenum (Mo) or molybdenum alloy (Mo alloy), or a low-resistance opaque conductive material, such as chrome (Cr), tantalum (Ta), or titanium (Ti). However, such materials may constitute a multi-layered structure having two conductive films having different physical properties.

Such a structure of the sub-pixel is not limited to the aforementioned one, but may be modified variously.

A third insulating layer 115c is formed on the substrate 101 where the driving transistor has been formed, and the third insulating layer 115c may be formed of an inorganic insulating material such as a silicon nitride (SiNx) or silicon oxide (SiO$_2$). The drain electrode 123 of the driving transistor is electrically connected to the first electrode 118 via a second contact hole formed within the third insulating layer 115c. The first electrode 118 may be formed of a transparent conductive material, such as indium tin oxide (ITO) or indium zinc oxide (IZO), or may be formed of a reflective conductive material, such as aluminum, silver, or an alloy thereof.

A partition wall 115d is formed at a boundary of pixel regions above the third insulating layer 115c. The partition wall 115d separates the respective pixel regions from each other, thereby preventing light of specific colors from being output from the neighboring pixel regions in a mixed manner.

The aforementioned organic compound layer 130 of the organic light emitting diode may be formed on an entire surface of the substrate 101. However, the present invention is not limited to this configuration. That is, the organic compound layer 130 may be formed on the first electrode 118 between the partition walls 115d.

The second electrode 128 is formed in a display region on the organic compound layer 130. The second electrode 128 is supplied with a common voltage. And, the second electrode 128 may be formed of a reflective conductive material including calcium (Ca), barium (Ba), magnesium (Mg), aluminum, silver, etc., or may be formed of a transparent conductive material such as ITO or IZO.

A capping layer 129, formed of an organic material, such as polymer, may be entirely formed in a pixel portion of the substrate 101 where the second electrode 128 has been formed. However, the present invention is not limited to this configuration. That is, the capping layer 129 may not be formed.

In the case of a top emission type organic light emitting display device, the capping layer 129 collects light to enhance light emission due to its specific refractivity. On the other hand, in the case of a bottom emission type organic light emitting display device, the capping layer 129 serves to buffer the second electrode 128 of the organic light emitting diode.

The capping layer 129 may serve as a single optical control layer. The capping layer 129 may increase reflectance at an interface between itself and the outside by controlling a refractivity difference between itself and the outside. Through such a reflectance increase, the capping layer 129 may provide a micro-cavity effect at a specific wavelength. In this case, the capping layer 129 may be formed to have a different thickness at each sub-pixel. The thin film encapsulation layer 140 formed as a multi-layer is formed on the capping layer 129.

The protection film 145, formed as a multi-layer for encapsulation, may be disposed on an entire surface of the substrate 101 including the thin film encapsulation layer 140. The adhesive 146 may be provided between the substrate 101 and the protection film 145. However, the present invention is not limited to this configuration. For example, the protection film 145 need not be formed.

The optical member 160 in the first example embodiment of the present invention, which is configured to prevent reflection of light incident from the outside, may be provided on the protection film 145. The optical member 160 enhances visibility of the organic light emitting display device and minimizes loss of light emitted from the organic light emitting diode to the outside by restricting reflection of external light. The optical member 160 in the first example embodiment of the present invention may include a first retardation layer 161, a second retardation layer 162, a linear polarizer 163, and a third retardation layer 164 that are sequentially disposed on the organic light emitting diode.

An anti-reflection film (AR film) 166 may be disposed on the third retardation layer 164. The anti-reflection film 166 may be formed by a wet-type coating (anti-reflection coating) or a dry-type sputtering (anti-reflection sputter).

Here, the optical member 160 may be formed on an encapsulation member including the thin film encapsulation layer 140. However, the present invention is not limited to this configuration. Thus, the optical member 160 may be formed between the encapsulation member and the organic light emitting diode.

In this case, the first retardation layer 161 may be formed as a cholesteric liquid crystal (CLC) layer. The CLC layer has a layered structure. Because long axes of molecules of the CLC are aligned in a preset direction in a single plane, in a direction perpendicular to the plane, molecules are aligned in a helical shape. Thus, the CLC layer has an entire helical structure. Light is circularly polarized while passing through the CLC layer.

The CLC layer may selectively transmit or reflect circular polarization. That is, the CLC layer may selectively transmit or reflect right circular polarization or left circular polarization. Light may be selectively transmitted or reflected based on a direction of circular polarization (right circular polarization or left circular polarization). Hereinafter, for convenience, a case will be explained in which the CLC layer is inclined by about 45° from a polarization axis of the linear polarizer 163. In this case, the CLC layer reflects circular polarization having the same direction as a helical incidence direction, but transmits circular polarization having an opposite direction to the helical incidence direction.

The second retardation layer 162 may be formed as a first quarter wave plate (QWP) for generating a retardation of $\lambda/4$. The linear polarizer 163 has a polarization axis and linearly polarizes light in a direction of the polarization axis. More specifically, the linear polarizer 163 passes light parallel to the polarization axis therethrough, and absorbs light not parallel to the polarization axis. Thus, if light passes through the linear polarizer 163, the light is linearly polarized in a direction of the polarization axis.

The third retardation layer 164 may be also formed as a second quarter wave plate (QWP) for generating retardation of $\lambda/4$. The second retardation layer 162 may have an optical axis inclined by about 45° from the polarization axis of the linear polarizer 163.

The second retardation layer 162 and the linear polarizer 163 may constitute a circular polarizer. That is, if the optical axis of the second retardation layer 162 forms an angle of 45° with a transmission axis of the linear polarizer 163 after the second retardation layer 162 is arranged, external light is reflected from the inside of the organic light emitting diode 102. The reflected light is discharged to the outside in a direction perpendicular to the transmission axis of the linear polarizer 163, thereby reducing reflectance.

The second retardation layer 162, (the first QWP) has a negative dispersion characteristic. Accordingly, reflectance is reduced to less than 2%, and color cast is minimized. That is, because wavelength dispersion of red, green, and blue colors is minimized, reflectance is reduced and color cast is minimized.

For reference, unlike a positive dispersion film, a negative dispersion film has a small retardation value when a wavelength is reduced. The negative dispersion film has a smaller change of a retardation value than a positive dispersion film according to each wavelength.

In the first example embodiment of the present invention, the first retardation layer 161 (the CLC layer) is provided under the second retardation layer 162 (the first QWP) so that light reflected from the CLC layer is recycled to enhance brightness. That is, light reflected from the CLC layer is recycled to enhance brightness by about 70%, and light passing through the CLC layer is converted by the second retardation layer 162 to have polarization parallel to the transmission axis of the linear polarizer 163. This may further increase transmittance. Here, transmittance is increased to 70% from 40% without increase of reflectance, and color cast is minimized as compared to the case of the related art where a circularly polarizer is used.

In the first example embodiment of the present invention, the third retardation layer 164 is provided on the linear polarizer 163 such that a screen change into black is prevented when a transmission axis of sunglasses and the transmission axis of the linear polarizer 163 are perpendicular to each other. The third retardation layer 164 may have an optical axis inclined by about 45° from the polarization axis of the linear polarizer 163. That is, a crossing angle between the optical axis of the third retardation layer 164 and the polarization axis of the linear polarizer 163 is about 45°. With such a configuration, linear polarization passing through the linear polarizer 163 is converted into circular polarization by the third retardation layer 164. As a crossing angle between the optical axis of the third retardation layer 164 and the polarization axis of the linear polarizer 163 is approximately 45°, linear polarization is converted into light similar to circular polarization by the third retardation layer 164.

For instance, the third retardation layer 164 may be formed as a second quarter wave plate (QWP). In this case, when a user wears sunglasses, the user can see images at all angles.

Hereinafter, an operation of the organic light emitting display device at the time of transmission and reflection in the first example embodiment of the present invention will be explained in more detail with reference to the drawings.

Figure 9:
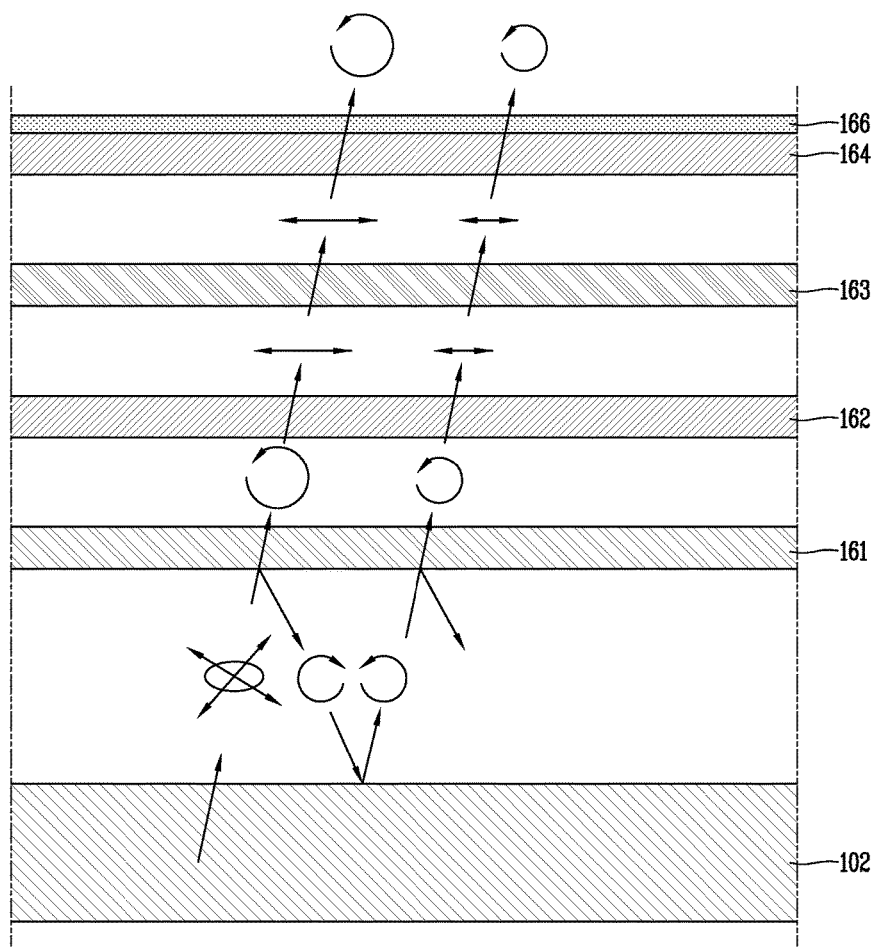
FIG. 9 is a view illustrating an example of a change of a polarization state in an organic light emitting display device during light transmission according to the first example embodiment of the present invention.

Firstly, an operation of the organic light emitting display device at the time of transmission will be explained with reference to FIG. 9. FIG. 9 is a view illustrating an example of a change of a polarization state at the time of transmission in an organic light emitting display device according to the first example embodiment of the present invention.

As shown in FIG. 9, when a voltage is applied to the organic light emitting display device (light emitted from the organic light emitting diode 102 is in a non-polarization state having various phases), light emitted from the light emitting layer passes through the second electrode to travel toward the first retardation layer 161. Among the light having passed through the second electrode, the light component of left circular polarization passes through the first retardation layer 161 to travel toward the second retardation layer 162, and the light component of right circular polarization is reflected by the first retardation layer 161 to the second electrode.

As aforementioned, for convenience, a case where the first retardation layer 161 is inclined by about 45° from the polarization axis of the linear polarizer 163 will be explained. For convenience, the CLC layer is described as a left-handed CLC layer when viewed from the upper side. However, the present invention is not limited to this structure.

Transmission of light occurs in a direction viewed from the lower side. Accordingly, during transmission, the right circular polarization having the same direction as a helical direction of the CLC layer (right-handed CLC layer) is reflected, but the left circular polarization having an opposite direction to the helical direction of the CLC layer (right-handed CLC layer) is transmitted.

Light having passed through the first retardation layer 161 has retardation of 45° while passing through the second retardation layer 162, thereby being linearly polarized. Then, the linear polarization (⇆) passes through the linear polarizer 163 to travel toward the third retardation layer 164.

As aforementioned, the third retardation layer 164 may have an optical axis inclined by about 45° from the polarization axis of the linear polarizer 163. Thus, linear polarized light passing through the linear polarizer 163 is converted into circular polarization by the third retardation layer 164.

Right circular polarized light traveling toward the second electrode is reflected by the second electrode, the first electrode, or the like, and thus, its phase is converted into left circular polarization. Further, light may be reflected by not only electrodes of the organic light emitting diode 102 but also other wires. The left circular polarization is emitted to the outside via the first retardation layer 161, the second retardation layer 162, the linear polarizer 163 and the third retardation layer 164, sequentially, as aforementioned.

In the organic light emitting display device in the first example embodiment of the present invention, because light is recycled by the first retardation layer 161, light emitted from the organic light emitting diode 102 is emitted to the outside with a relatively small loss. This may increase transmittance.

Figure 10:
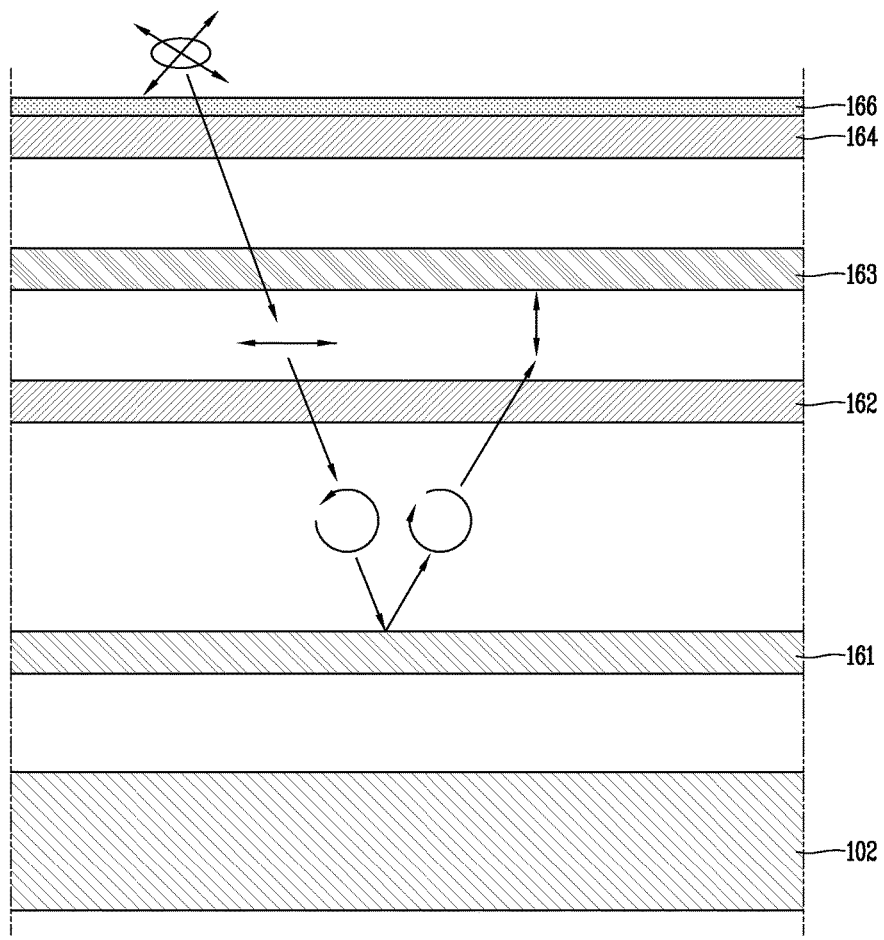
FIG. 10 is a view illustrating an example of a change of a polarization state in an organic light emitting display device during light reflection according to the first example embodiment of the present invention.

Next, a path of light incident into the organic light emitting display device from the outside through the optical member will be explained. FIG. 10 is a view illustrating an example of a change of a polarization state in an organic light emitting display device during reflection according to the first example embodiment of the present invention.

As shown in FIG. 10, external light (non-polarization state) is linearly polarized in a direction of the polarization axis by the third retardation layer 164 and the linear polarizer 163. The linear polarization is converted into circular polarization by the second retardation layer 162, a quarter wave plate (QWP). Here, the optical axis of the second retardation layer 162 is inclined from the polarization axis of the linear polarizer 163 by 45°.

Because an axis of linear polarization forms an angle of 45° with the optical axis of the second retardation layer 162, linear polarization is converted into circular polarization by the second retardation layer 162. In this case, the circular polarization is left circular polarization. However, the present invention is not limited to this arrangement. That is, the second retardation layer 162 may be disposed such that light having passed through the second retardation layer 162 may be converted into right circular polarization.

The left circular polarization is reflected by rather than passing through the first retardation layer 161. The reason is because an optical axis of the first retardation layer 161 in the first embodiment of the present invention forms an angle of about 45° with the polarization axis of the linear polarizer 163, and the CLC layer is a left-handed CLC layer when viewed from the linear polarizer 163. However, as aforementioned, the present invention is not limited to this configuration. Thus, the first retardation layer 161 may pass left circular polarization, and may reflect right circular polarization. However, in this case, light having passed through the second retardation layer 162 should be right circular polarization. That is, the first retardation layer 161 should reflect light circularly polarized via the linear polarizer 163 and the second retardation layer 162.

The left circular polarization reflected by the first retardation layer 161 is converted into right circular polarization and travels to the second retardation layer 162. In this case, the right circular polarization is converted into linear polarization via the second retardation layer 162. Here, the right circular polarization is converted into linear polarization in a direction different from an incidence direction (e.g., in a direction perpendicular to the polarization axis of the linear polarizer 163). Thus, the right circular polarization does not pass through the linear polarizer 163, thereby effectively restrict reflection of external light.

In the case of transmission, light emitted to the outside is light circularly polarized by the third retardation layer 164. Accordingly, a user may see images at all angles even when he or she wears sunglasses.

As aforementioned, the second retardation layer (the first QWP) in the first example embodiment of the present invention has a negative dispersion characteristic. This may reduce reflectance to less than 2%, and may minimize color cast.

Figure 11A:
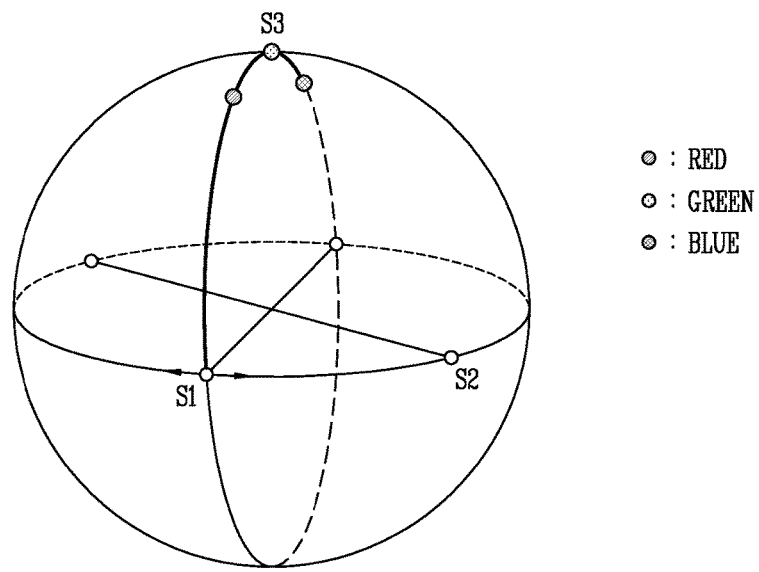
FIGS. 11A and 11B are Poincare spheres illustrating a change of a polarization state in a general organic light emitting display device after light passes through a circular polarizer.
Figure 11B:
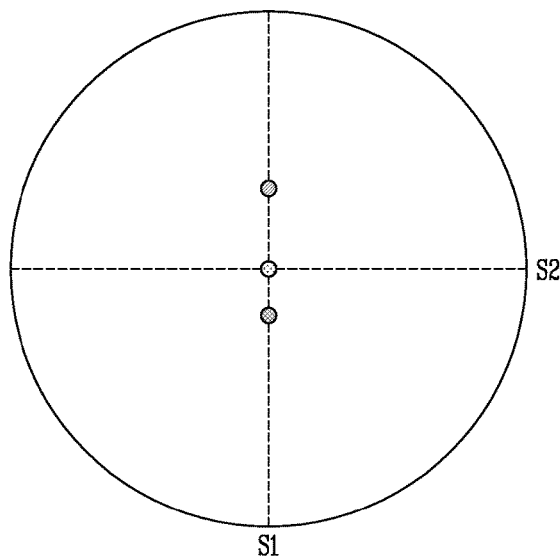
Figure 12A:
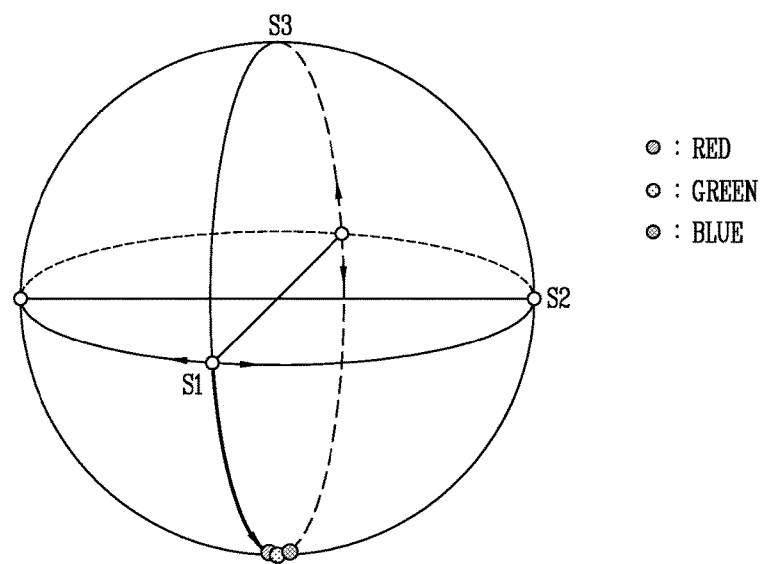
FIGS. 12A and 12B are Poincare spheres illustrating a change of a polarization state in an organic light emitting display device according to the first example embodiment of the present invention after light passes through an optical member.
Figure 12B:
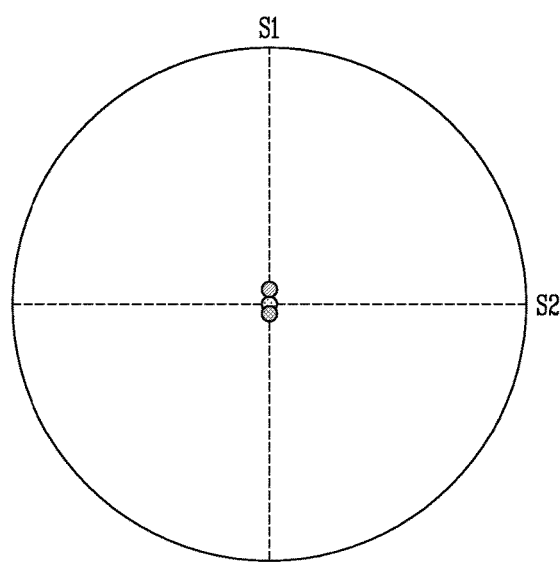

FIGS. 11A and 11B are Poincare spheres illustrating a change of a polarization state in a general organic light emitting display device after light passes through a circular polarizer. FIG. 11B illustrates the change of the polarization state shown in FIG. 11A in two dimensions. FIGS. 12A and 12B are Poincare spheres illustrating a change of a polarization state in an organic light emitting display device according to the first embodiment of the present invention after light passes through an optical member. FIG. 12B illustrates the change of the polarization state shown in FIG. 12A in two dimensions.

To geometrically analyze an optical characteristic of a transparent medium such as a liquid crystal, a Poincare sphere of a polarization state is used. A Jones vector may represent only complete polarization, and stokes parameters defined by the following formula 1 are used to represent more general partial polarization.

$$S0 = <|E_x|^2> + <|E_y|^2>$$

$$S1=<|E_x|^2>-<|E_y|^2>$$

$$S2=2|E_x||E_y|<\cos(\phi_x-\phi_y)>$$

$$S3=2|E_x||E_y|<\sin(\phi_x-\phi_y)>$$ [Formula 1]

Here, < > denotes a time average, and an inequality of $S0^2>S1^2+S2^2+S3^2$ is formed between four variables. And, an equation is applied only to complete polarization.

In the case of complete polarization, standardized variables $s_1$, $s_2$ and $s_3$ obtained by dividing S1, S2 and S3 by S0 (brightness of light) satisfy the following formula 2.

$$s_1^2 s_2^2+s_3^2=1$$ [Formula 2]

Formula 2 represents an equation of a sphere having a radius of 1 in a three-dimensional space. The sphere, composed of points having ($s_1$, $s_2$, $s_3$) as orthogonal coordinates, is a Poincare sphere. In the Poincare sphere, all points above the equator line correspond to linear polarization, the North Pole corresponds to a right hand circular polarization, and the South Pole corresponds to a left hand circular polarization. All points on the northern hemisphere correspond to right hand elliptical polarization, and all points on the southern hemisphere correspond to left hand elliptical polarization. An unitary matrix, representing a change of a polarization state when light passes through a transparent medium, may be interpreted as a rotational transform on a Poincare sphere.

As aforementioned, the Poincare sphere represents all polarization states of light thereon. Once an optical axis of an optical device and a retardation value are provided, a polarization state may be easily predicted based on the Poincare sphere.

With reference to FIGS. 11A and 11B, linear polarization passing through a linear polarizer is positioned at S1.

In the related art, circular polarization having retardation of 45° after passing through a quarter wave plate (QWP) is positioned at S3. Generally, a retardation value is significantly influenced by a wavelength. Thus, even if an optical design is executed based on a red wavelength range (~550 nm), a retardation value larger than a reference value occurs at a blue wavelength range (~450 nm), and a retardation value smaller than the reference value occurs at a red wavelength range (~650 nm). As a result, chromatic dispersion occurs because a distance changes according to each wavelength as shown on the Poincare sphere of FIGS. 11A and 11B.

On the other hand, with reference to FIGS. 12A and 12B, in the first example embodiment of the present invention, a negative dispersion film is applied to the second retardation layer to restrict dispersion of red and blue light. This may reduce reflectance and minimize chromatic dispersion.

That is, as shown on the Poincare sphere of FIGS. 12A and 12B, chromatic dispersion is minimized at RGB wavelengths.

In this case, a negative dispersion characteristic ($\Delta n(450/550)$) of the second retardation layer is in the range of 0.70~0.82. In the organic light emitting display device in the first example embodiment of the present invention, owing to the second retardation layer having a negative dispersion characteristic ($\Delta n(450\ nm)<\Delta n(550\ nm)<\Delta n(650\ nm)$), a path of light of a wavelength of each of RGB colors converges more than those in the related art.

Further, when a touch screen panel and a sample to be measured are attached onto a black acryl plate with an air gap (~0.12 T) to measure reflectance and a reflective color, reflectance is reduced to 3.99%, which is much lower than that in a comparative embodiment (~11.66%). Here, the comparative embodiment corresponds to a state where no film is deposited on a touch screen panel, and the sample to be measured is obtained by laminating the linear polarizer on a negative dispersion QWP.

In this case, a reflective color has x and y color coordinates of 0.310, 0.324, which is similar to 0.311, 0.324 of the comparative embodiment. Thus, color distortion has not occurred.

As aforementioned, because the third retardation layer 164 is disposed on the linear polarizer 163, a user may see images at all angles even when he or she wears polarizing sunglasses. Further, a retardation value in a planar direction (Re) may be set to be in a range of 100 nm~140 nm to minimize color cast.

Figure 13A:
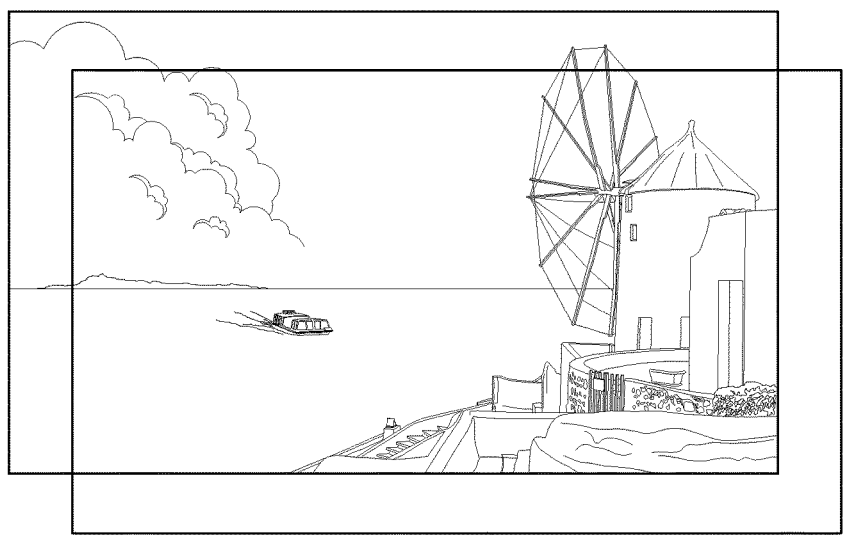
FIGS. 13A and 13B are exemplary views illustrating an image recognition state in a general organic light emitting display device before and after wearing sunglasses, respectively.
Figure 13B:
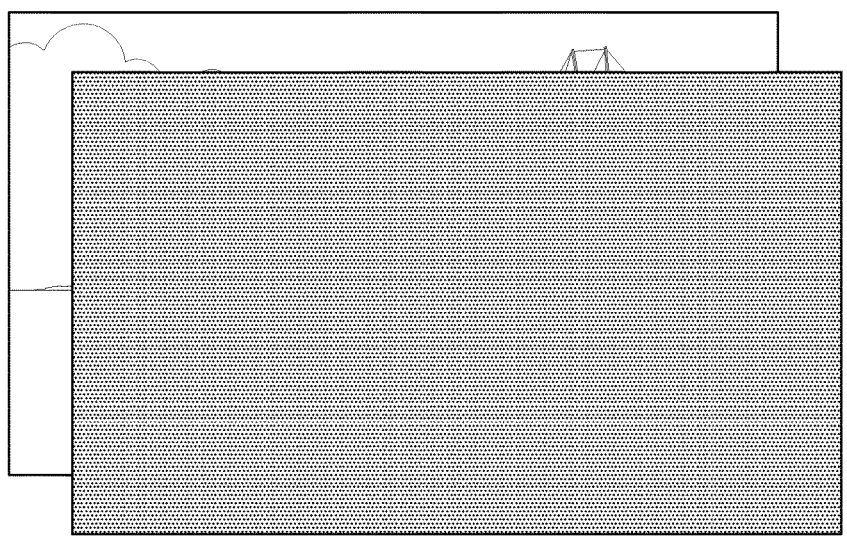

FIGS. 13A and 13B are exemplary views illustrating an image recognition state in a general organic light emitting display device before and after wearing sunglasses, respectively. FIG. 13A exemplarily shows an image recognition state before a user wears sunglasses, and FIG. 13B exemplarily shows an image recognition state after a user wears sunglasses.

With reference to FIGS. 13A and 13B, if an absorption axis of the linear polarizer is at an angle of 90°, an output image is provided in linear polarization having a transmission direction of 0°. In this case, if a transmission axis of sunglasses is orthogonal to the transmission axis of the linear polarizer of the organic light emitting display device, e.g., if the transmission axis of the sunglasses has an angle of 90° with the polarization of light propagating from the display device, an image is seen in black.

Figure 14:
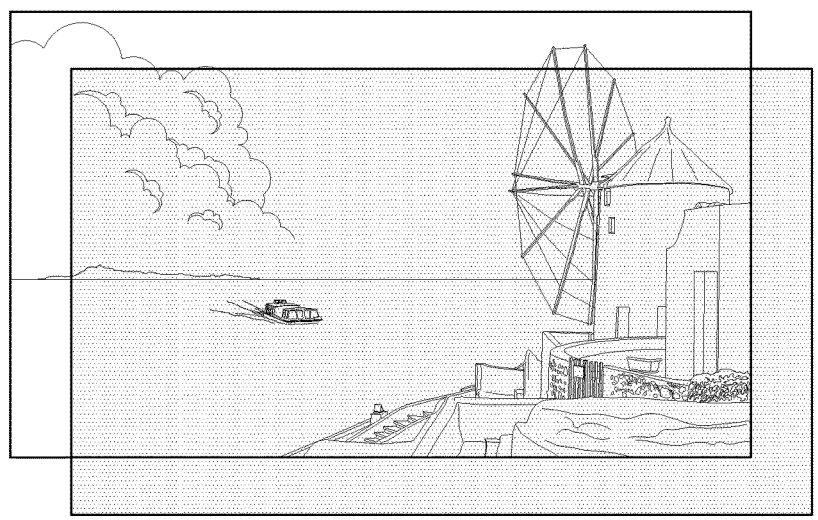
FIG. 14 is a view illustrating an example of an image recognition state in an organic light emitting display device according to the first example embodiment of the present invention after wearing sunglasses.

FIG. 14 is a view illustrating an example of an image recognition state in an organic light emitting display device according to the first example embodiment of the present invention after the user wears sunglasses. With reference to FIG. 14, if another QWP is provided on the linear polarizer to convert linear polarization into circular polarization, a user may see an image at all angles even when wearing polarizing sunglasses.

Figure 15:
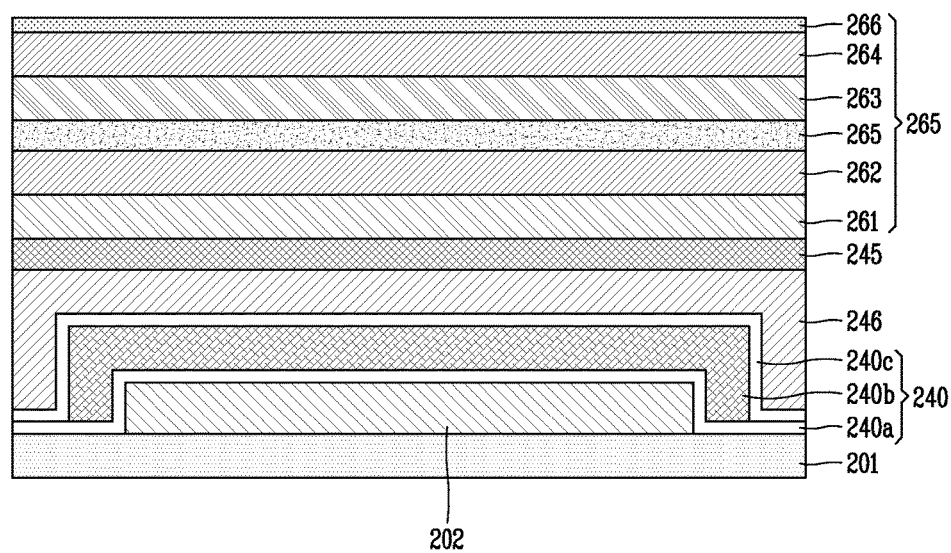
FIG. 15 is a view illustrating a structure of an organic light emitting display device according to a second example embodiment of the present invention.

FIG. 15 is a view illustrating a structure of an organic light emitting display device according to a second example embodiment of the present invention.

The organic light emitting display device shown in FIG. 15 has a similar configuration to the organic light emitting display device in the first example embodiment of the present invention, but the organic light emitting display device in the second example embodiment of the present invention further includes a base substrate disposed between the second retardation layer and the linear polarizer. The base substrate may be formed of 0-TAC acryl and may attenuate an external shock by enhancing intensity of an optical member.

With reference to FIG. 15, a capping layer (not shown) may be formed on an upper surface of a substrate 201 where an organic light emitting diode 202 has been formed. Then, a primary protection film 240a, an organic film 240b, and a secondary protection film 240c may be sequentially formed on the capping layer as encapsulation means, thereby forming a thin film encapsulation layer 240. However, as aforementioned, the number of inorganic films and the number of organic films in the thin film encapsulation layer 240 are not limited to this configuration.

A protection film 245 formed of multiple layers for encapsulation is disposed on an entire surface of the substrate 201 including the secondary protection film 240c. Further, a transparent adhesive 246 may be disposed between the substrate 201 and the protection film 245. An optical member 260, configured to prevent reflection of light incident from the outside in the second embodiment of the present invention, is provided on the protection film 245. Although not shown, the organic light emitting diode 202 includes a first electrode, an organic compound layer, and a second electrode, as aforementioned.

In the organic light emitting diode having such a structure, holes injected from the first electrode via a hole transport layer and electrons injected from the second electrode via an electron transport layer are coupled to each other at a light emitting layer. Then, the hole and the electron move to a low energy level. During such processes, light of a wavelength corresponding to an energy difference at the light emitting layer is generated. In this case, for emission of white light, the light emitting layer may include a red light emitting layer, a green light emitting layer, and a blue light emitting layer. However, the present invention is not limited to this configuration.

A capping layer, formed of an organic material, such as polymer, may be entirely formed at a pixel portion of the substrate 201 where the second electrode has been formed. However, the present invention is not limited to this configuration. That is, the capping layer may not be formed. The thin film encapsulation layer 240 formed of multi layers may be formed on the capping layer.

The protection film 245 formed of multiple layers for encapsulation may be disposed on an entire surface of the substrate 201 including the thin film encapsulation layer 240. And the adhesive 246 may be disposed between the substrate 201 and the protection film 245. However, the present invention is not limited to this configuration. That is, the protection film 245 may not be formed.

The optical member 260, configured to prevent reflection of light incident from the outside, is provided on the protection film 245. The optical member 260 enhances visibility of the organic light emitting display device and minimizes loss of light emitted from the organic light emitting diode to the outside, by restricting reflection of external light. The optical member 260 may include a first retardation layer 261, a second retardation layer 262, a linear polarizer 263 and a third retardation layer 264, which are sequentially disposed on the organic light emitting diode.

In the second example embodiment of the present invention, a base substrate 265 may be formed of 0-TAC acryl and may be disposed between the second retardation layer 262 and the linear polarizer 263. Further, the optical member 260 may be formed on an encapsulation member including the thin film encapsulation layer 240. However, the present invention is not limited to this configuration. Thus, the optical member 260 may be formed between the encapsulation member and the organic light emitting diode.

The first retardation layer 261 may be formed as a CLC layer. The second retardation layer 262 may be formed as a first quarter wave plate (QWP) for generating retardation of λ/4. The linear polarizer 263 has a polarization axis, and linearly polarizes light in a direction of the polarization axis. The third retardation layer 264 may be also formed as a second quarter wave plate (QWP) for generating retardation of λ/4. The second retardation layer 262 may have an optical axis inclined by about 45° from the polarization axis of the linear polarizer 263.

The second retardation layer 262 and the linear polarizer 263 may constitute a circular polarizer. That is, when the second retardation layer 262 is arranged to make its optical axis have an angle of 45° with a transmission axis of the linear polarizer 263, external light is reflected from the inside of the organic light emitting diode 202. The reflected light is discharged to the outside in a state perpendicular to the transmission axis of the linear polarizer 263. This arrangement may reduce reflectance.

Like the first example embodiment, the second retardation layer 262 (the first QWP) in the second example embodiment of the present invention has a negative dispersion characteristic. Accordingly, reflectance is reduced to less than 2%, and color cast is minimized. That is, because wavelength dispersion of red, green, and blue colors is minimized, reflectance is reduced, and color cast is minimized.

In the second example embodiment of the present invention, the first retardation layer 261 (the CLC layer) is provided under the second retardation layer 262 (the first QWP), so light reflected from the CLC layer is recycled to enhance brightness. That is, light reflected from the CLC layer is recycled to enhance brightness by about 70%, and light passing through the CLC layer is converted by the second retardation layer 262 to have polarization parallel to the transmission axis of the linear polarizer 263. This arrangement may further increase transmittance.

In the second example embodiment of the present invention, transmittance is increased to 70% from 40% without an increase in reflectance, and color cast is more minimized as compared to the case of the related art where a circularly polarizer is used.

In the second example embodiment of the present invention, the third retardation layer 264 is provided on the linear polarizer 263 such that a screen change into black is prevented when a transmission axis of sunglasses and the transmission axis of the linear polarizer 263 are perpendicular to each other. The third retardation layer 264 may have an optical axis inclined by about 45° from the polarization axis of the linear polarizer 263. That is, a crossing angle between the optical axis of the third retardation layer 264 and the polarization axis of the linear polarizer 263 is about 45°. With such a configuration, light that is linearly polarized by the linear polarizer 263 is converted into circular polarization by the third retardation layer 264. Because a crossing angle between the optical axis of the third retardation layer 264 and the polarization axis of the linear polarizer 263 is approximately 45°, linear polarization is converted into light similar to circular polarization by the third retardation layer 264. For instance, the third retardation layer 264 may be formed as a second quarter wave plate (QWP). In this case, when a user wears sunglasses, the user can recognize images at all angles.

It will be apparent to those skilled in the art that various modifications and variations can be made in the organic light emitting display device of the present invention without departing from the spirit or scope of the invention. Thus, it is intended that the present invention cover the modifications and variations of this invention provided they come within the scope of the appended claims and their equivalents.

What is claimed is:

1. An optical assembly in a display device, comprising:
   a linear polarizer;
   a first quarter wave plate (QWP) layer under the linear polarizer;
   a base substrate between the first QWP layer and the linear polarizer;
   a cholesteric liquid crystal (CLC) layer under the first QWP layer; and
   a second QWP layer directly on the linear polarizer,
   wherein the first QWP is closer to a panel portion of the display device than the second QWP.

2. The optical assembly according to claim 1, wherein the first QWP layer has a negative dispersion characteristic.

3. The optical assembly according to claim 1, wherein an optical axis of the second QWP layer is oriented at substantially 45 degrees with respect to a polarization axis of the linear polarizer.

4. The optical assembly according to claim 1, wherein the second QWP layer has a retardation value in a planar direction of 100 nm-140 nm.

5. The optical assembly according to claim 1, wherein an optical axis of the first QWP layer is oriented at substantially 45 degrees with respect to a polarization axis of the linear polarizer.

6. The optical assembly according to claim 2, wherein the negative dispersion characteristic of the first QWP layer is substantially 0.70-0.82.

7. An optical assembly in a display device, comprising:
a cholesteric liquid crystal (CLC) layer;
a first quarter wave plate (QWP) layer on the CLC layer;
a base substrate on the first QWP layer;
a linear polarizer on the base substrate;
a second QWP layer directly on the linear polarizer; and
an anti-reflection film on the second QWP layer,
wherein the first QWP is closer to a panel portion of the display device than the second QWP.

8. The optical assembly according to claim 7, wherein an optical axis of the second QWP layer is oriented at substantially 45 degrees with respect to a polarization axis of the linear polarizer.

9. The optical assembly according to claim 7, wherein an optical axis of the first QWP layer is oriented at substantially 45 degrees with respect to a polarization axis of the linear polarizer.

10. The optical assembly according to claim 7, wherein the second QWP layer has a retardation value in a planar direction of 100 nm-140 nm.

11. A display device, comprising:
a substrate;
an plurality of sub-pixels on the substrate, each of the sub-pixels including at least one organic light emitting diode (OLED); and
an optical assembly on the sub-pixels including a linear polarizer, a first quarter wave plate (QWP) layer under the linear polarizer, a base substrate between the first QWP layer and the linear polarizer, a cholesteric liquid crystal (CLC) layer under the first QWP layer, and a second QWP layer directly on the linear polarizer,
wherein the first QWP is closer to the plurality of sub-pixels than the second QWP.

12. The display device according to claim 11 wherein an optical axis of the second QWP layer is oriented at substantially 45 degrees with respect to a polarization axis of the linear polarizer.

13. The display device according to claim 11 wherein the first QWP layer has a negative dispersion characteristic of substantially 0.70-0.82.

14. The display device according to claim 11, wherein an optical axis of the first QWP layer is oriented at substantially 45 degrees with respect to a polarization axis of the linear polarizer.

15. The display device according to claim 11, wherein the second QWP layer has a retardation value in a planar direction of 100 nm-140 nm.

* * * * *